(12) United States Patent
Park

(10) Patent No.: US 8,537,090 B2
(45) Date of Patent: Sep. 17, 2013

(54) DRIVING CIRCUIT AND ORGANIC ELECTROLUMINESCENCE DISPLAY THEREOF

(75) Inventor: Yong Sung Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1380 days.

(21) Appl. No.: 11/647,336

(22) Filed: Dec. 29, 2006

(65) Prior Publication Data

US 2007/0279342 A1 Dec. 6, 2007

(30) Foreign Application Priority Data

Jun. 5, 2006 (KR) ........................ 10-2006-0050483

(51) Int. Cl.
*G09G 3/36* (2006.01)
(52) U.S. Cl.
USPC .................. 345/98; 341/145; 345/76; 345/82
(58) Field of Classification Search
USPC .................. 345/76–83, 98–100; 341/145
See application file for complete search history.

(56) References Cited

U.S. PATENT DOCUMENTS

| 5,877,717 | A | 3/1999 | Tu et al. |
| 6,781,536 | B1 | 8/2004 | Martins |
| 7,034,732 | B1 | 4/2006 | Fackenthal et al. |
| 7,184,017 | B2 * | 2/2007 | Koyama et al. ............... 345/100 |
| 7,239,567 | B2 | 7/2007 | Kwon |
| 7,595,776 | B2 | 9/2009 | Hashimoto et al. |
| 2004/0048069 | A1 | 3/2004 | Yamada |
| 2004/0189572 | A1 | 9/2004 | Nose |
| 2005/0088329 | A1 * | 4/2005 | Tsuchi ........................ 341/144 |
| 2005/0168416 | A1 * | 8/2005 | Hashimoto et al. ............. 345/76 |
| 2005/0219098 | A1 * | 10/2005 | Koyama et al. ............... 341/144 |
| 2007/0052641 | A1 | 3/2007 | Hagino et al. |

FOREIGN PATENT DOCUMENTS

| JP | 04-237091 | 8/1992 |
| JP | 05-181436 | 7/1993 |
| JP | 11-064825 | 3/1999 |
| JP | 2001-272655 | 10/2001 |

(Continued)

OTHER PUBLICATIONS

Search Report issued in corresponding European Patent Application No. 07251958.0 dated Sep. 20, 2007.
Office Action issued by the Japanese Patent Office in Japanese Patent Application No. 2006-199921 on Dec. 8, 2009.
Notice of Allowance issued in Korean Patent Application No. 10-2006-0050482 on Nov. 30, 2007.

(Continued)

*Primary Examiner* — Michael Pervan
(74) *Attorney, Agent, or Firm* — Christie, Parker & Hale, LLP

(57) ABSTRACT

An organic electroluminescence display capable of reducing a size of a data driving unit by decreasing an area of a D/A converter, and a driving circuit thereof. The data driving unit includes a first decoder to generate a first selection signal to correspond to a data signal; a first switch unit to receive first voltages and second voltages and to select one of the first voltages or the second voltages to correspond to the data signal; a second switch unit to select first and second reference voltages from the selected first or second voltages in response to the first selection signal; a second decoder to generate a second selection signal to correspond to the data signal; and a grey level voltage generating unit to receive and distribute the first and second reference voltages, selected by the switch units, to generate grey level voltages and to select and output one grey level voltage to correspond to the second selection signal.

8 Claims, 4 Drawing Sheets

(56) References Cited

FOREIGN PATENT DOCUMENTS

| | | |
|---|---|---|
| JP | 2004-004788 | 1/2004 |
| JP | 2004-212668 | 7/2004 |
| JP | 2004-246182 | 9/2004 |
| JP | 2004-343746 | 12/2004 |
| KR | 10-2002-0004281 | 1/2002 |
| KR | 10-2003-0068480 | 8/2003 |
| KR | 10-2004-0075628 | 8/2004 |
| KR | 10-2006-0019800 | 3/2006 |

OTHER PUBLICATIONS

U.S. Appl. No. 11/599,982, filed Nov. 16, 2006, Yong Sung Park, Samsung Mobile Display Co., Ltd.
U.S. Appl. No. 11/645,678, filed Dec. 27, 2006, Yong Sung Park, Samsung Mobile Display Co., Ltd.
U.S. Office Action dated Feb. 5, 2010, issued in corresponding U.S. Appl. No. 11/645,678.
U.S. Office Action dated Mar. 10, 2010, issued in corresponding U.S. Appl. No. 11/599,982.

* cited by examiner

DRIVING CIRCUIT AND ORGANIC ELECTROLUMINESCENCE DISPLAY THEREOF

CROSS-REFERENCE TO RELATED APPLICATIONS

This application claims the benefit of Korean Patent Application No. 2006-50483, filed on Jun. 5, 2006, in the Korean Intellectual Property Office, the disclosure of which is incorporated herein by reference.

BACKGROUND OF THE INVENTION

1. Field of the Invention

Aspects of the present invention relate to a driving circuit and an organic electroluminescence display using the same, more specifically to a driving circuit capable of decreasing a grey level error to improve linearity by preventing a voltage sag generated in an analog switch, and an organic electroluminescence display using the same.

2. Description of the Related Art

A flat panel display has a plurality of pixels arranged in a matrix type pattern on a substrate as a display area, and a scan line and a data line connected to each pixel to display an image by selectively applying a data signal to the pixels. The flat panel displays are classified into passive matrix-type light-emitting displays and active matrix-type light-emitting displays according to a driving mode of respective pixels. The active matrix-type light-emitting displays which turn on light by individual pixels has been mainly used in terms of a high resolution, good contrast and fast operating speed.

Active matrix flat panel displays have been used as displays in such applications as personal computers, portable phones, PDAs, etc., or as monitors of various information appliances. Active matrix flat panel displays have been fabricated of liquid crystal displays (LCDs) using a liquid crystal panel, organic electroluminescence displays using organic electroluminescence devices, plasma display panels (PDPs) using plasma panels, etc. as have been known in the art. Recently, various light-emitting displays having a smaller weight and volume than a cathode ray tube have been developed, and attention has been particularly paid to the organic electroluminescence display which exhibits excellent luminous efficiency, luminance and viewing angle and has a rapid response time.

FIG. 1 is a circuit view showing a configuration of a conventional organic electroluminescence display 10. Referring to FIG. 1, the organic electroluminescence display 10 includes a pixel unit 100, a data driving unit 200 and a scan driving unit 300. The pixel unit 100 includes a plurality of data lines (D1,D2 ... Dm-1,Dm) and a plurality of scan lines (S1,S2 ... Sn-1,Sn), and a plurality of pixels 101 formed in a region defined by a plurality of the data lines (D1,D2 ... Dm-1,Dm) and a plurality of the scan lines (S1,S2 ... Sn-1, Sn). Each pixel 101 includes a pixel circuit and an organic electroluminescence device, and the pixel 101 generates a pixel current in the pixel circuit to flow to the organic electroluminescence device, the pixel current flows in the pixels according to data signals transmitted through a plurality of the data lines (D1, D2 ... Dm-1,Dm) and scan signals transmitted through a plurality of the scan lines (S1,S2 ... Sn-1, Sn).

The data driving unit 200 is connected with a plurality of the data lines (D1,D2 ... Dm-1,Dm), and generates data signals to sequentially transmit a row of data signals to a plurality of the data lines (D1,D2 ... Dm-1,Dm). The data driving unit 200 also has a digital-to-analog (D/A) converter, and generates a grey level voltage which is converted from a digital signal into an analog signal by the D/A converter, thereby to transmit the grey level voltage to the data lines (D1,D2 ... Dm-1,Dm).

The scan driving unit 300 is connected to a plurality of scan lines (S1,S2 ... Sn-1,Sn), and generates a scan signal to transmit the scan signal to a plurality of the scan lines (S1, S2 ... Sn-1,Sn). A certain row is selected by the scan signals, and a data signal is transmitted to a pixel 101 arranged in the selected row, such that a current corresponding to the data signal is generated in the pixel.

FIG. 2 is a circuit view showing a resistance unit which generates a grey level voltage in the D/A converter used in the data driving unit 200 of the organic electroluminescence display 10 as shown in FIG. 1. Referring to FIG. 2, assume that the resistance unit generates 8 grey level voltages for illustration. In order to generate 8 grey level voltages, 8 resistances (R1, R2, ... R8) are connected in series, and a first reference voltage having a high voltage (VrefH) and a second reference voltage having a low voltage (VrefL) are respectively transmitted to both ends of the resistances connected in series, and then the first reference voltage (VrefH) and the second reference voltage (VrefL) become a grey level voltage distributed by the 8 resistances.

The organic electroluminescence display 10 as configured above is preferably realized by preparing a small size of a driving circuit to manufacture a small size of the organic electroluminescence display 10.

SUMMARY OF THE INVENTION

Accordingly, aspects of the present invention are designed to solve such drawbacks of the prior art and/or realize additional advantages, and therefore an aspect of the present invention is to provide a driving circuit capable of reducing a size of a data driving unit by decreasing an area of a D/A converter, and an organic electroluminescence display using the same.

Aspects of the present invention provide an organic electroluminescence display including a pixel unit, a data driving unit and a scan driving unit, wherein the data driving unit includes a first decoder to generate a first selection signal to correspond to a data signal; a first switch unit to receive a plurality of first voltages from a first bus and a plurality of second voltages from a second bus and to select the first voltages or the second voltages to correspond to the data signal; a second switch unit to select a first reference voltage and a second reference voltage from the selected first voltages or the selected second voltages in response to the first selection signal and to transmit the selected first reference voltage and selected second reference voltage; a second decoder to generate a second selection signal to correspond to a data signal; and a grey level voltage generating unit to receive and distribute the first selected reference voltage and the second selected reference voltage, selected by the second switch unit, to generate a plurality of grey level voltages and to select and output one grey level voltage out of the plurality of the grey level voltages to correspond to the second selection signal.

Aspects of the present invention provide a driving circuit including a first decoder to generate a first selection signal to correspond to a data signal; a first switch unit to receive a plurality of first voltages from a first bus and a plurality of second voltages from a second bus and to select the first voltages or the second voltages to correspond to the data signal; a second switch unit to select a first reference voltage and a second reference voltage from the selected first voltages or the selected second voltages in response to the first selection signal; a second decoder to generate a second selection signal to correspond to a data signal; and a grey level voltage generating unit to receive and distribute the first reference voltage and the second reference voltage, selected by the second switch unit, to generate a plurality of grey level voltages and to select and output one grey level voltage out of the plurality of the grey level voltages to correspond to the second selection signal.

Further aspects of the present invention provide a method for driving an organic electroluminescence display, including selecting a plurality of first voltages or a plurality of second voltages to correspond to a data signal and selecting one plurality of voltages out of the plurality of the first voltages and the plurality of the second voltages; selecting a first reference voltage and a second reference voltage out of the selected first voltages or the selected second voltages to correspond to the data signal; distributing the first reference voltage and the second reference voltage using the lower bit of the data signal; generating a grey level voltage from the distributed first and second reference voltages; and transmitting the generated grey level voltage to a data line.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE EMBODIMENTS

Figure 1:
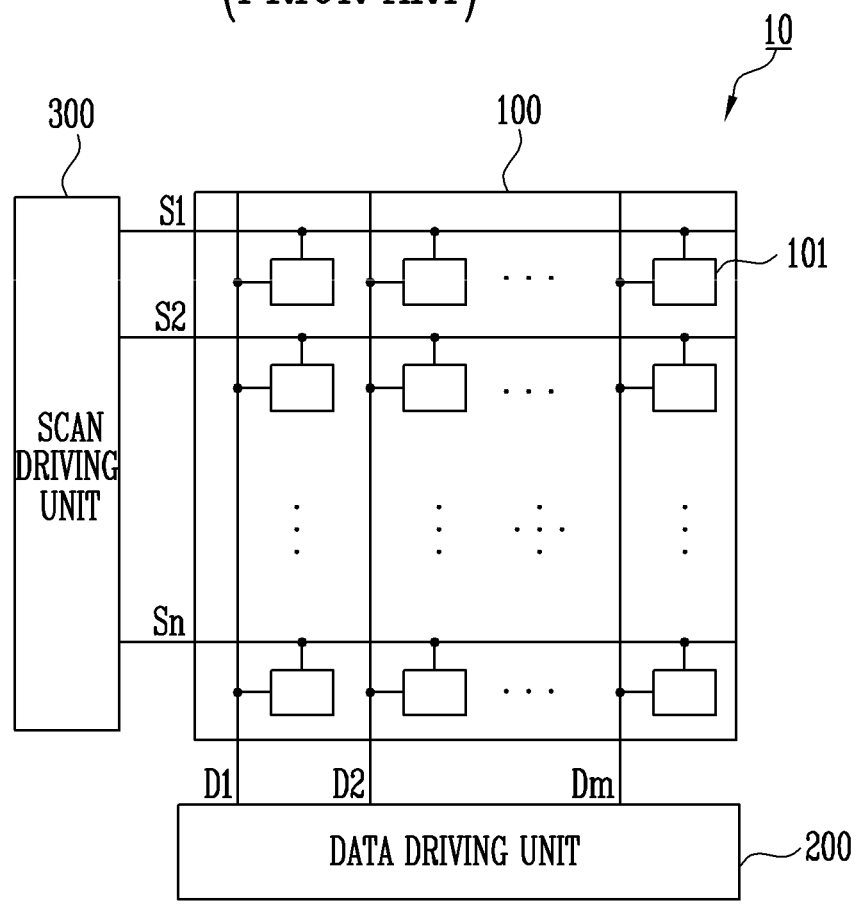
FIG. 1 is a circuit view showing a configuration of a conventional organic electroluminescence display.
Figure 2:
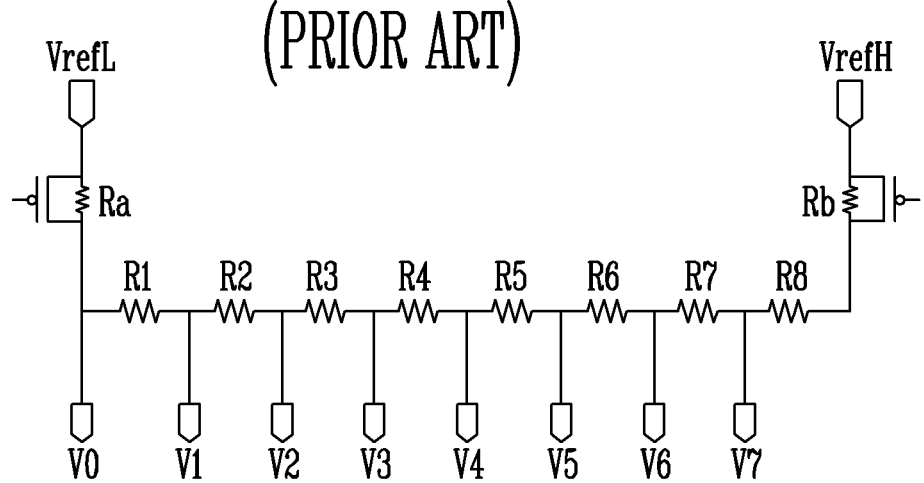
FIG. 2 is a circuit view showing a resistance unit which generates a grey level voltage in a conventional D/A converter.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Here, when one element is connected to another element, one element may be not only directly connected to another element but also indirectly connected to another element via another element. Further, irrelevant elements are omitted for clarity.

Figure 3:
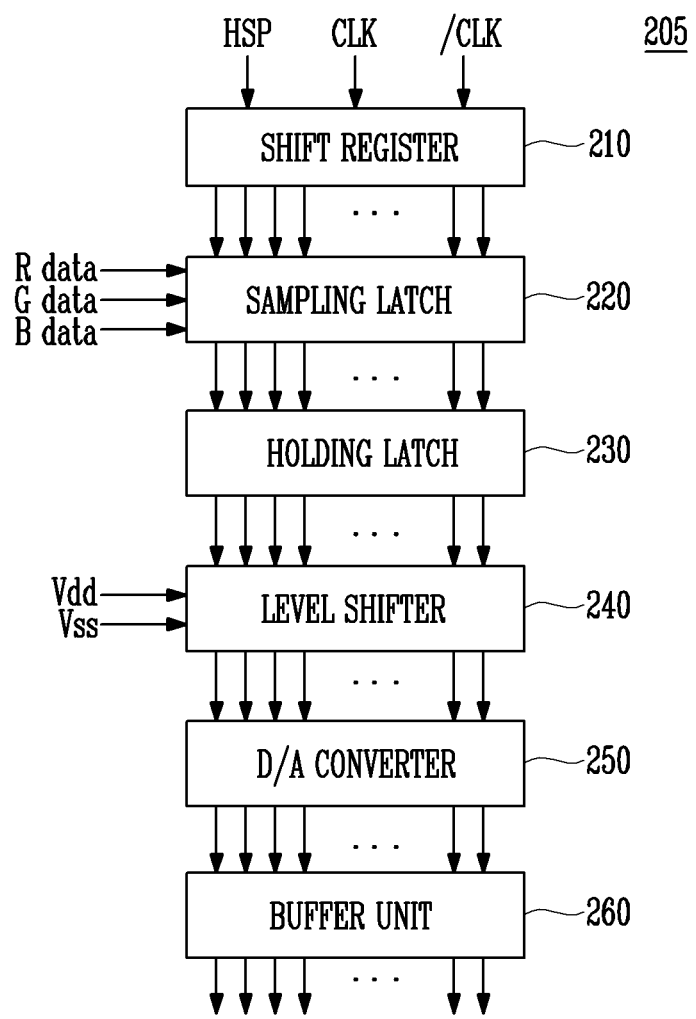
FIG. 3 is a schematic view showing a data driving unit used in an organic electroluminescence display according to an embodiment of the present invention.

FIG. 3 is a circuit view showing a data driving unit used in an organic electroluminescence display according to an embodiment of the present invention. Referring to FIG. 3, the data driving unit 205 includes a shift register 210, a sampling latch 220, a holding latch 230, a level shifter 240, a D/A converter 250 and a buffer unit 260.

The shift register 210 comprises a plurality of flip flops, and the shift register 210 controls the sampling latch 220 to correspond to a clock signal (CLK and /CLK) and a synchronizing signal (HSP). The sampling latch 220 sequentially receives a row of data signals according to a control signal of the shift register 210, and then outputs the data signals in parallel. A mode for sequentially receiving a signal and outputting the signal in parallel is referred to as Serial-In-Parallel-Out (SIPO). The holding latch 230 receives the signal in parallel, and then outputs the signal in parallel. A mode for receiving a signal in parallel and outputting the signal in parallel is referred to as Parallel-In-Parallel-Out (PIPO). The level shifter 240 changes a level of the signal, outputted from the holding latch 230, into an operating voltage of the system and transmits the operating voltage to the D/A converter 250. The D/A converter 250 transmits the signal, received as the digital signal, as an analog signal to select a corresponding grey level voltage and transmits the grey level voltage to the buffer unit 260, and the buffer unit 260 amplifies the grey level voltage, and then transmits the amplified grey level voltage to data lines.

Figure 4:
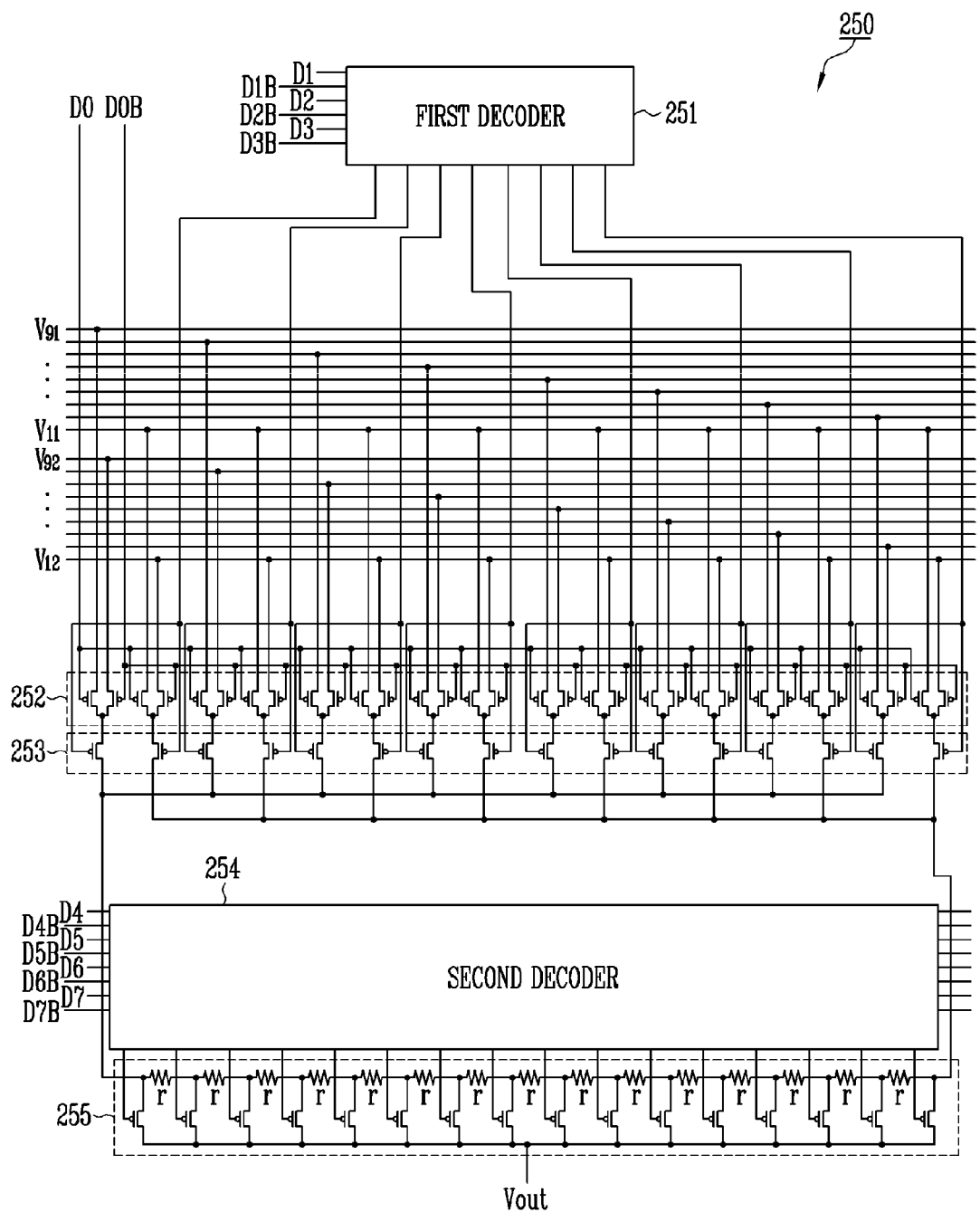
FIG. 4 is a schematic view showing a configuration of the D/A converter according to an embodiment of the present invention.

FIG. 4 is a schematic view showing a configuration of the D/A converter according to an embodiment of the present invention. Referring to FIG. 4, the D/A converter 250 includes a first decoder 251, a first switch unit 252, a second switch unit 253, a second decoder 254 and a grey level voltage generating unit 255. Assume that the D/A converter 250 displays 256 grey levels, and the data signal transmitted to the D/A converter 250 comprises 8-bit signals.

In order to generate 256 grey levels from 8-bit signals, the first decoder 251 uses 3 bits D1/D1B, D2/D2B, and D3/D3B, that is, all bits except an uppermost bit D0/D0B out of the upper 4 bits of the data signal to generate a first selection signal. The first switch unit 252 comprises 32 transistors, and odd-numbered transistors from a left to a right direction have respective sources connected to first bus lines (v11,v21 ... v91), respective gates to receive the uppermost bit signal, and respective drains connected to the second switch unit 253. Even-numbered transistors have respective sources connected to second bus lines (v12,v22 ... v92), respective gates to receive an accessory signal of the uppermost bit signal, and respective drains connected to the second switch unit 253. At this time, the first bus lines (v11,v21 ... v91) and the second bus lines (v12, v22 ... v92) transmit nine first voltages and nine second voltages, respectively, and one group of voltages out of the voltages transmitted through the first bus lines (v11,v21 ... v91) and the voltages transmitted through the second bus lines (v12,v22 ... v92) is transmitted to the second switch unit 253 through the first switch unit 252 using the uppermost bit of the data signal. That is to say, the nine voltages, transmitted through the first bus lines (v11,v21 ... v91) to correspond to the uppermost bit of the data signal, are sequentially transmitted to the second switch unit 253 through the odd-numbered transistors, and the nine voltages transmitted through the second bus lines (v12,v22 ... v92) to correspond to the uppermost bit of the data signal, are sequentially transmitted through the even-numbered transistors, to the second switching unit 253. The second bus lines (v12, v22 ... v92) and the first switch unit 252 are connected in the same manner as in the first bus lines (v11,v21 ... v91) and the first switch unit 252. At this time, the first voltages are higher than the second voltages. The transistors connected to the first bus lines (v11,v21 ... v91) and the transistors connected to the second bus lines (v12,v22 ... v92) are operated by receiving the uppermost bit signal of the data signal, and the transistors connected to the first bus lines (v11,v21 ... v91) and the transistors connected to the second bus lines (v12, v22 ... v92) are operated in a reverse manner as follows. When the uppermost bit is set to 1, a grey level of the data signal is estimated to range from 128 to 256 grey levels, and therefore the odd-numbered transistors are in an ON state to select the first bus lines (v11,v21 ... v91), and when the uppermost bit is set to 0, the grey level of the data signal is estimated to range from 0 to 127 grey levels, and therefore the even-numbered transistors are in an ON state to select the second bus lines (v12,v22 ... v92). That is to say, one group of bus lines out of the first bus lines (v11,v21 ... v91) and the second bus lines (v12,v22 ... v92) is selected by the transistors. The odd-numbered transistors sequentially transmit the voltage to the second switch unit 253 in order from a highest voltage to a lower voltage, and the even-numbered transistors sequentially transmit the voltage to the second switch unit 253 in order from below the lower voltage to a lowest voltage.

The second switch unit 253 carries out a switching operation in response to the first selection signal generated in the first decoder 251, and the 16 transistors selectively output the signals, transmitted from the first switch unit 252, according to the first selection signal, and then transmit the signals to the grey level voltage generating unit 255. At this time, two transistors of the second switch unit 253 are connected to respective ends of the grey level voltage generating unit 255, and the second switch unit 253 outputs two voltages from one group of bus lines, selected by the first switch unit 252, out of the first bus lines (v11,v21 ... v91) and the second bus lines (v12,v22 ... v92) to select a first reference voltage and a second reference voltage. The first reference voltage is changed by the first selection signal, and the second reference voltage is reduced to the lowest voltage which is transmitted through the selected bus lines.

The second decoder 254 receives a lower 4 bits D4/D4B, D5/D5B, D6/D6B, and D7/D7B of the data signal to generate a 16-bit second selection signal. Sixteen resistances are connected in series in the grey level voltage generating unit 255, and the first reference voltage and the second reference voltage, selected by the second switch unit 253, are transmitted to respective ends of the grey level voltage generating unit 255, and then 16 grey level voltages are generated by the 16 resistances. The grey level voltage generating unit 255 receives the second selection signal to select and output one grey level voltage out of the 16 grey level voltages. Accordingly, the total 256 grey level voltages are generated by the uppermost bit of the data signal, the first selection signal and the second selection signal.

Figure 5:
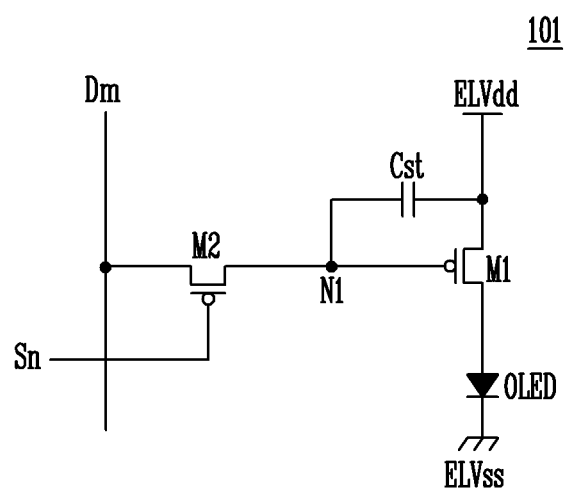
FIG. 5 is a circuit view showing one example of a pixel used in an organic electroluminescence display according to an embodiment of the present invention.

FIG. 5 is a circuit view showing one example of a pixel 101 used in the organic electroluminescence display according to an embodiment of the present invention. Referring to FIG. 5, the pixel is connected to the data line (Dm), the scan line (Sn) and the pixel power line (ELVdd) and includes a first transistor (M1), a second transistor (M2), a capacitor (Cst) and an organic electroluminescence device (OLED).

The first transistor (M1) has a source connected to the pixel power line (ELVdd); a drain connected to an anode electrode of the organic electroluminescence device (OLED); and a gate connected to a first node (N1). The second transistor (M2) has a source connected to the data line (Dm); a drain connected to the first node (N1); and a gate connected to the scan line (Sn). The capacitor (Cst) is connected between the first node (N1) and the pixel power line (ELVdd) to maintain a voltage between the first node (N1) and the pixel power line (ELVdd) during a predetermined period. The organic electroluminescence device (OLED) includes the anode electrode, a cathode electrode and an emitting layer, wherein if the anode electrode is connected to a drain of the first transistor (M1) and the cathode electrode is connected to the low-potential power source (ELVSS) so as to allow a current to flow from an anode electrode to a cathode electrode of the organic electroluminescence device (OELD) to correspond to the voltage which is applied to the gate of the first transistor (M1), then the light is emitted in the emitting layer and a brightness is adjusted to correspond to a capacity of the current. The capacitor (Cst) is connected between the first node (N1) and the pixel power line (ELVdd) to maintain a voltage between the first node (N1) and the pixel power line (ELVdd) during a predetermined period. The organic electroluminescence device (OLED) includes the anode electrode, a cathode electrode and an emitting layer, wherein if the anode electrode is connected to a drain of the first transistor (M1) and the cathode electrode is connected to the low-potential power resource (ELVSS) so as to allow a current to flow from an anode electrode to a cathode electrode of the organic electroluminescence device (OELD) to correspond to the voltage which is applied to the gate of the first transistor (M1), then the light is emitted in the emitting layer and a brightness is adjusted to correspond to a capacity of the current.

According to the driving circuit according to aspects of the present invention and the organic electroluminescence display using the same, a size of the D/A converter may be decreased by selecting a reference voltage using an analog switch since the uppermost bit is connected to the analog switch.

Although several embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An organic electroluminescence display comprising:
   a pixel unit comprising pixels to display an image;
   a data driving unit to generate display signals in the pixels of the pixel unit; and
   a scan driving unit to generate a current corresponding to the display signals in the pixels of the pixel unit,
   wherein the data driving unit comprises:
      a first decoder to generate a first selection signal to correspond to a data signal;
      a first switch unit to receive a plurality of first voltages from a plurality of first bus lines separated from each other, and a plurality of second voltages from a plurality of second bus lines separated from each other, and to select the first voltages or the second voltages to correspond to the data signal;
      a second switch unit to select a first reference voltage and a second reference voltage from the selected first voltages or the selected second voltages in response to the first selection signal;
      a second decoder, separate from the first decoder, to generate a second selection signal to correspond to the data signal; and
      a grey level voltage generating unit to receive and distribute the first reference voltage and the second reference voltage, selected by the second switch unit, to generate a plurality of grey level voltages and to select and output one grey level voltage out of the plurality of the grey level voltages to correspond to the second selection signal, and
   wherein the data signal is classified into upper bits and lower bits, the first bus lines or the second bus lines are selected by an uppermost bit out of the upper bits, remaining upper bits except the uppermost bit are transmitted to the first decoder to generate the first selection signal, and the lower bits are transmitted to the second decoder to generate the second selection signal.

2. The organic electroluminescence display according to claim 1, wherein the first switch unit comprises:
  a plurality of first transistors to select the plurality of first voltages when the uppermost bit of the data signal has a first value; and
  a plurality of second transistors to select the plurality of second voltages when the uppermost bit of the data signal has a second value.

3. The organic electroluminescence display according to claim 2, wherein the second switch unit comprises:
  a plurality of third transistors to select the first reference voltage from the selected first voltages or the selected second voltages in response to the first selection signal; and
  a plurality of fourth transistors to select the second reference voltage from the selected first voltages or the selected second voltages in response to the first selection signal.

4. A driving circuit comprising:
  a first decoder to generate a first selection signal to correspond to a data signal;
  a first switch unit to receive a plurality of first voltages from a plurality of first bus lines separated from each other, and a plurality of second voltages from a plurality of second bus lines separated from each other, and to select the first voltages or the second voltages to correspond to the data signal;
  a second switch unit to select a first reference voltage and a second reference voltage from the selected first voltages or the selected second voltages in response to the first selection signal;
  a second decoder, separate from the first decoder, to generate a second selection signal to correspond to the data signal; and
  a grey level voltage generating unit to receive and distribute the first reference voltage and the second reference voltage, selected by the second switch unit, to generate a plurality of grey level voltages and to select and output one grey level voltage out of the plurality of the grey level voltages to correspond to the second selection signal,
  wherein the data signal is classified into upper bits and lower bits, the first bus lines or the second bus lines are selected by an uppermost bit out of the upper bits, remaining upper bits except the uppermost bit are transmitted to the first decoder to generate the first selection signal, and the lower bits are transmitted to the second decoder to generate the second selection signal.

5. The driving circuit according to claim 4, wherein the first switch unit comprises:
  a plurality of first transistors to select the plurality of first voltages when the uppermost bit of the data signal has a first value; and
  a plurality of second transistors to select the plurality of second voltages when the uppermost bit of the data signal has a second value.

6. The driving circuit according to claim 5, wherein the second switch unit comprises:
  a plurality of third transistors to select the first reference voltage from the selected first voltages or the selected second voltages in response to the first selection signal; and
  a plurality of fourth transistors to select the second reference voltage from the selected first voltages or the selected second voltages in response to the first selection signal.

7. A D/A converter comprising:
  a first switch unit to select first voltages or second voltages to correspond to an uppermost bit of a data signal classified into upper bits and lower bits;
  a first decoder to generate a first selection signal to correspond to the upper bits of the data signal except the uppermost bit;
  a second switch unit to select a first reference voltage and a second reference voltage from the selected first voltages or the selected second voltages in response to the first selection signal;
  a second decoder, separate from the first decoder, to generate a second selection signal to correspond to the lower bits of the data signal; and
  a grey level voltage generating unit to receive and distribute the first reference voltage and the second reference voltage, to generate grey level voltages, and to select and output one of the grey level voltages to correspond to the second selection signal.

8. An organic electroluminescence display comprising:
  a pixel unit comprising pixels to display an image;
  a data driving unit to generate display signals in the pixels of the pixel unit, wherein the data driving unit comprises a D/A converter; and
  a scanning unit to generate a current corresponding to the display signals in the pixels of the pixel unit,
  wherein the D/A converter comprises:
    a first switch unit to select first voltages or second voltages to correspond to an uppermost bit of a data signal classified into upper bits and lower bits;
    a first decoder to generate a first selection signal to correspond to the upper bits of the data signal except the uppermost bit;
    a second switch unit to select a first reference voltage and a second reference voltage from the selected first voltages or the selected second voltages in response to the first selection signal;
    a second decoder, separate from the first decoder, to generate a second selection signal to correspond to the lower bits of the data signal; and
    a grey level voltage generating unit to receive and distribute the first reference voltage and the second reference voltage, to generate grey level voltages, and to select and output one of the grey level voltages to correspond to the second selection signal.

* * * * *